United States Patent [19]
De Araujo et al.

[11] Patent Number: 5,463,244
[45] Date of Patent: Oct. 31, 1995

[54] ANTIFUSE PROGRAMMABLE ELEMENT USING FERROELECTRIC MATERIAL

[75] Inventors: Carlos A. P. De Araujo; Larry D. McMillan; Joseph D. Cuchiaro, all of Colorado Springs, Colo.

[73] Assignee: Symetrix Corporation, Colorado Springs, Colo.

[21] Appl. No.: 249,870

[22] Filed: May 26, 1994

[51] Int. Cl.⁶ .................................................. H01L 27/02
[52] U.S. Cl. ............................ 257/530; 257/15; 437/922
[58] Field of Search ....................... 257/530, 15; 437/922

[56] References Cited

U.S. PATENT DOCUMENTS

| | | | |
|---|---|---|---|
| 4,322,822 | 3/1982 | McPherson | 365/182 |
| 4,488,262 | 12/1984 | Basire et al. | 365/104 |
| 4,499,557 | 2/1985 | Holmberg et al. | 365/163 |
| 4,502,208 | 3/1985 | McPherson | 29/584 |
| 4,507,757 | 3/1985 | McElroy | 365/104 |
| 4,538,884 | 9/1985 | Masaki | 350/362 |
| 4,543,594 | 9/1985 | Mohsen et al. | 357/51 |
| 4,899,205 | 2/1990 | Hamdy et al. | 357/51 |
| 5,126,282 | 6/1992 | Chiang et al. | 257/530 |
| 5,248,632 | 9/1993 | Tung et al. | 437/195 |
| 5,250,459 | 10/1993 | Lee | 437/52 |
| 5,250,464 | 10/1993 | Wong et al. | 437/170 |
| 5,373,169 | 12/1994 | McCollum et al. | 257/530 |

*Primary Examiner*—J. Carroll
*Attorney, Agent, or Firm*—Duft, Graziano & Forest

[57] ABSTRACT

An electrically programmable antifuse element using ferroelectric materials for the insulative dielectric layer, methods for producing same, and an integrated circuit applying a plurality of ferroelectric antifuse elements in a two dimensional matrix of rows and columns for use as a programmable logic device (PLD) or as a programmable read-only memory (PROM). A ferroelectric material is formed between two conductive electrodes to create a ferroelectric antifuse element. In an alternative embodiment, a plurality of chemically distinct materials is layered to form the dielectric layer. The combined application of an AC electric field and a DC electric field breaks down the ferroelectric material to form a low-resistance conductive filament. The synergy of the two electric fields permits programming antifuse elements of the present invention by applying DC electric fields as low as 2 volts amplitude. In the preferred embodiment, as compared to prior designs, antifuse devices of the present invention display higher resistivity in the unprogrammed state due to the high dielectric constant of ferroelectric materials and lower resistivity in the programmed state because the ferroelectric material breaks down into metal oxide conductive filaments. The resistivity of the conductive filament may be reduced further by the blending of materials through substitution rather than doping processes.

22 Claims, 2 Drawing Sheets

ANTIFUSE PROGRAMMABLE ELEMENT USING FERROELECTRIC MATERIAL

BACKGROUND OF THE INVENTION

1. Field of the Invention

This invention relates to integrated circuit antifuse devices which provide an electrically programmable connection between two unconnected points of a circuit. More specifically, the present invention relates to the use of a ferroelectric material in the antifuse elements of such antifuse programmable array devices.

2. Related art

This application relates to co-pending patent application Ser. No. 08/249,524 filed herewith, hereby incorporated by reference, and assigned to Symetrix Corporation.

3. Brief Description of the Prior Art

It is known to provide programmable integrated circuits which permit a user to customize the application of the circuit by programming ("blowing") electronic interconnections within the circuit to fulfill a specific application need. Integrated circuits such as Programmable Array Logic (PALs), Programmable Logic Devices (PLDs), Field Programmable Gate Arrays (FPGAs), and Programmable Read-Only Memories (PROM's) are typical of such programmable devices. These devices provide arrays of programmable elements which a user may elect to connect or disconnect by electrical means. "Fusible" devices are manufactured with each element initially connected and are programmed by applying sufficient current to an element to "blow" the fuse thereby disconnecting the element. "Antifuse" devices are manufactured with each element initially unconnected and are programmed by applying an electrical field across an element sufficient to cause a breakdown of an insulating material within an element. The breakdown of the insulating layer forms a conductive filament connecting the two previously unconnected points of the element.

A large class of such devices are one-time programmable (OTP) devices in that each element may be programmed only once to meet the requirements of a particular application. Once programmed, the element cannot be changed again. Most antifuse devices use a dielectric layer of material between the unconnected contacts to provide the electrical insulation between the contacts. In an electric field of sufficient strength, the dielectric material heats to the point of breakdown and forms a conductive filament through an aperture in the dielectric material. This conductive filament connects the two previously unconnected contacts of the programmable antifuse element.

Basire et al. in U.S. Pat. No. 4,488,262 (issued Dec. 11, 1984) teach the design of a PROM device implemented with an array of antifuse elements. Basire et al. disclose a device embodying a two dimensional array of antifuse elements with intersecting row and column electrodes disposed across the insulative layer of each antifuse element. An electric field is controllably applied across each antifuse element to be programmed. The field is applied to the row electrode and column electrode which intersect at the antifuse element to be programmed. A sufficiently large electric field breaks down the insulative layer between the two intersecting electrodes to form a conductive filament through the insulative layer.

It is desirable to use materials for the insulating layer which have high resistivity in the unprogrammed state and yet breakdown to form a conductive filament of low resistivity. However, such materials have presented problems in prior designs. Although it is desirable to maintain a high resistivity in the unprogrammed state, a high dielectric constant of the insulating material in the unprogrammed state requires a correspondingly high DC electric field amplitude to force the breakdown of the insulating material. When the required field amplitude rises too high for practical applications, some prior designs have taught the use of dopants applied to the electrodes or the insulating layer to improve conductivity. Hamdy et al. teach the use of arsenic dopants applied to one or both electrodes in U.S. Pat. No. 4,889,205 (issued Feb. 6, 1990). The arsenic is intended to reduce the resistivity of the conductive filament formed by the breakdown of the insulative layer. Similarly, Lee teaches in U.S. Pat. No. 5,250,459 (issued Oct. 5, 1993) the use of antimony as a dopant to be applied to one or both electrodes. The antimony flows into the conductive filament when formed by the breakdown of the insulative layer. However, these approaches typically alter both the programmed and unprogrammed resistivity.

Basire et al., at first reading, teach that a solution to the above problems is to use materials with a low dielectric constant, such as "transition metal oxides or titanate such as tantalum oxide, vanadium oxide, zirconium oxide, niobium oxide, barium titanate and strontium titanate." However, on closer analysis, some of the materials named by Basire et al., such as barium titanate and strontium titanate, are known to have high dielectric constants so they do not accurately reflect the desired properties as taught by the patent. Barium titanate and strontium titanate are ferroelectric materials, but the ferroelectric nature of the materials is not recognized in the teachings in Basire et al.

Another problem in prior designs arises from their use of silicon oxide or other similar materials to form the dielectric layer of each antifuse element. These materials are broken down into conductive material but then re-oxidize over time decreasing their conductivity eventually causing failure of the programmed antifuse element.

In addition, the minimum size of a programmed antifuse element constructed using a single material such as silicon oxide as the dielectric material is determined by the resistivity properties of silicon oxide when it is broken down to form a silicon conductive filament. Achieving a resulting resistance in a fused conductive filament low enough for high speed applications of the connected circuit requires a relatively large cross-sectional area of the conductive filament. The large cross-sectional area of the fused conductive filament determines the lower bound of the size of each fusible element and therefore the maximum density of fusible elements within an integrated circuit. Wong et al., in U.S. Pat. No. 5,250,464 (issued Oct. 5, 1993), teach a new method of constructing an antifuse element which reduces the surface area required for each element so as to increase the density of elements in a single programmable array device. However, the lower bound for the size of the antifuse element as taught by Wong et al. remains limited by the use of a dielectric material such as silicon oxide.

Solution to the Problem

The present invention teaches the construction of an antifuse element which uses ferroelectric materials in the dielectric layer. Ferroelectric materials have very high dielectric constants and so provide an excellent insulating layer between the two unconnected electrodes in the programmable antifuse elements of the present invention. However, when broken down, ferroelectric materials form conductive filaments of very low resistance to permit high speed signal transmission.

A combination of AC and DC electric fields is applied to breakdown the ferroelectric dielectric layer as taught by co-pending U.S. patent application Ser. No. 08/249,524. That is, an AC electric field is first applied across the antifuse element then followed by a DC electric field which causes the ferroelectric material to break down. The high dielectric constant of these materials increases the power dissipated through dielectric heating within the material in response to an applied AC electric field. The combined effects of the AC and DC electric fields breaks down the ferroelectric material more easily than could either field alone.

Additionally, the use of ferroelectric materials in the dielectric layer of the antifuse element of the present invention reduces the problem present in prior designs of oxidation of the fused conductive element of prior designs. Ferroelectric materials break down to form electrically conductive oxide materials and therefore do not change their resistivity over time due to oxidation of the conductive filament. Their resistivity remains relatively constant in comparison to silicon oxide materials used in prior designs.

The present invention also teaches that multiple stacked layers of materials of varying compositions may be used to form the dielectric layer of antifuse elements. The annealing of these dielectric materials caused by the combined application of AC and DC electric fields blends the various materials used in the dielectric layer to form a new material whose resistivity is determined by the materials blended to form the conductive filament. In this manner, a particular resistivity range may be selected in the manufacturing process. The ability to alter the resulting resistivity of the conductive filament also permits the filament cross-sectional size to be reduced by reducing the resistivity of the resultant filament. A reduced filament cross-sectional size enables the manufacturing of higher densities of antifuse elements within an integrated circuit. More generally, each layer of material may be manufactured by substitution of atoms in the lattice structures. Prior designs have recited doping processes to add certain elements to the dielectric or electrode layers of the antifuse elements. Doping allows a limited range of alteration of the electrical properties of the dielectric material. Further, the use of ferroelectric materials in the present invention permits a broader range of alteration of the dielectric material through substitution processes for binding locations within the lattice structure of the ferroelectric material. This broad range of alteration of the dielectric material permits the material to be customized for certain desired electrical and physical properties appropriate to a particular application of the antifuse element.

DETAILED DESCRIPTION OF THE DRAWING

Figure 1:
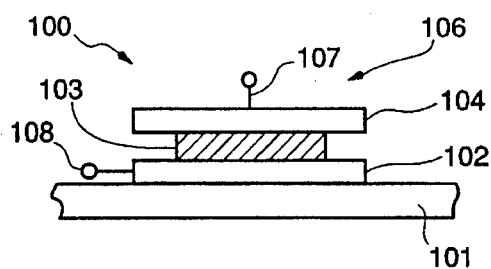
FIG. 1 depicts an antifuse element designed in accord with the methods of the present invention.

FIG. 1 shows a side cross-sectional view of an antifuse element 100 according to the present invention. Antifuse element 100 comprises first electrode 102, antifuse dielectric layer 103, and second electrode 104. Substrate 101 is preferably a single crystal silicon wafer. Alternatively, substrate 101 may comprise a layer of silicon dioxide on a silicon substrate. First electrode 102 is formed upon substrate 101 according to well known fabrication methods. Polysilicon is the preferred material for use in fabricating first electrode 102, although it may be composed of metal or other material deposited or otherwise formed upon substrate 101. Alternatively, first electrode 102 may be formed by doping of an area of substrate 101 intended to serve as electrode 102.

Antifuse dielectric layer 103 is next deposited or otherwise formed upon first electrode 102. Preferably, dielectric layer 103 is a layered superlattice material as disclosed in co-pending U.S. patent application Ser. No. 08/154,927 filed Nov. 18, 1993 and which is hereby incorporated by reference. Strontium bismuth tantalate ($SrBi_2Ta_2O_9$) and barium bismuth tantalate ($BaBi_2Ta_2O_9$) are examples of preferred layered superlattice materials which may be used in antifuse dielectric layer 103. Initial results indicate that the voltage level at which the material breaks down or fuses may be controlled by controlling the strontium/bismuth ratio in strontium bismuth tantalate. Dielectric layer 103 may alternatively comprise a perovskite ferroelectric material of the form $ABO_3$, $A'A''BO_3$, $AB'B''O_3$, $A'A''B'B''O_3$, where A', A", B' and B" are different metal elements. Preferably, A, A', A", are metals selected from the group of metals consisting of Ba, Bi, Sr, Pb, Ca, and La, and B, B', and B" are metals selected from the group consisting of Ti, Zr, Ta, Mo, W, and Nb. B, B', and B" elements are collectively referred to herein as B-site materials. BST, PZT and PLZT are examples of perovskite ferroelectric materials which may be used in antifuse dielectric layer 103. Preferably, dielectric layer 103 is comprised of a material which may be tuned for fusing or breakdown characteristics as well as resistivity. Many other ferroelectric materials may be used to form antifuse dielectric layer 103. It is also understood that the term "ferroelectric" as used herein may include materials that do not exhibit ferroelectric properties at room temperature but are none the less classified as ferroelectrics.

In the preferred embodiment, dielectric layer 103 is formed over first electrode 102 by depositing a liquid precursor, drying, and then annealing as recited in co-pending U.S. patent application Ser. No. 08/154,760 filed Nov. 18, 1993 which is hereby incorporated by reference. Alternatively, dielectric layer 103 may be formed over first electrode 102 by sputtering, chemical vapor deposition (CVD), or other known processes.

Second electrode 104 is formed on antifuse dielectric layer 103 and is preferably comprised of polysilicon or one or more metal layers formed by well known processes. Antifuse dielectric layer 103 serves as an insulator due to the high dielectric constant of materials selected for antifuse dielectric layer 103. First electrode 102 and second electrode 104 are manufactured unconnected as described above due to the insulation provided by antifuse dielectric layer 103. As recited in co-pending U.S. patent application Ser. No. 08/249,524, application of AC and DC electric fields across first electrode 102 and second electrode 104 of antifuse element 100 of FIG. 1 causes the breakdown of antifuse dielectric layer 103 to form a conductive filament completing the circuit between previously unconnected first electrode 102 and second electrode 104.

Antifuse element 100 also includes a fusing means 106 for controllably altering dielectric layer 103 to form an electrical conductor connecting first electrode 102 and second electrode 104. Fusing means 106 further comprises terminals 107 and 108 in the embodiment of FIG. 1. Terminals 107 and 108 are preferably implemented as wiring layers, word lines, bit lines, decoders etc. in the integrated circuit as well-known in the art (FIG. 5), but for simplicity these elements are shown in FIG. 1 by the conventional symbol for an electrical terminal since these elements essentially comprise a means for applying electrical power across the electrodes 102 and 104. Fusing means 106, in general, comprises any means of applying electrical power to first electrode 102 and second electrode 104 to create an electrically conductive path between the two electrodes.

Figure 2:
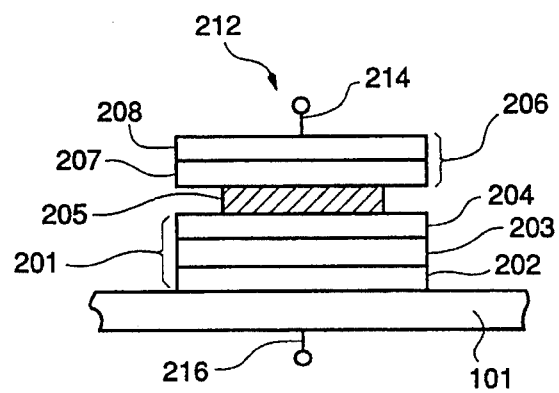
FIG. 2 shows an alternative exemplary embodiment of the present invention wherein barrier layers separate the electrodes from the dielectric layer of the antifuse element.

FIG. 2 depicts a side cross-sectional view of an alternative exemplary embodiment of an antifuse element 200 of the present invention. First electrode 201 of FIG. 2 is deposited or otherwise formed on substrate 101. In this embodiment, first electrode 201 comprises an adhesion layer 202, a barrier layer 203, and a metal layer 204. Adhesion layer 202 provides better adhesion of electrode 201 to substrate 101. Barrier layer 203 is formed atop adhesion layer 202 to prevent migration of atoms between silicon substrate 101 and antifuse dielectric layer 205 to be deposited atop first electrode 201. Metal layer 204 provides improved electrical contact with antifuse dielectric layer 205 as compared to barrier layer 203. It is known in the art that certain combinations of materials at the boundary of layers can react in such a manner that atoms migrate between the layers altering the chemical and electrical properties of the materials. It is also known in the art to use barrier layer materials in semiconductor structures to reduce the effects of boundary layer atomic interactions. The need for, and selection of a material for barrier layer 203 depends on the selection of materials to be used for substrate 101, first electrode 201, and antifuse dielectric layer 205. In this embodiment of the present invention, barrier layer 203 preferably comprises titanium nitride (TiN).

Antifuse dielectric layer 205 is now deposited or otherwise formed atop first electrode 201. Preferably, dielectric layer 205 is a layered superlattice material as recited above. In the preferred embodiment, dielectric layer 205 is formed over first electrode 201 by depositing a liquid precursor, drying, and then annealing as recited above.

Next, a second electrode 206 comprising metal layer 207 and barrier layer 208 is deposited or otherwise formed atop antifuse dielectric layer 205. The need for, and selection of, a material for barrier layer 208 depends on the materials used for antifuse dielectric layer 205, second electrode 206, and a capping or passivation layer (not shown) to be formed finally atop second electrode 206. In this embodiment of the present invention, barrier layer 208 preferably comprises titanium nitride (TiN).

In the embodiment of FIG. 2, fusing means 212 comprises terminal 214 connected to barrier layer 208 and terminal 216 connected to substrate 101. As in FIG. 1, terminals 214 and 216 are depicted using the standard symbol for terminals but are preferably implemented as wiring layers in the integrated circuit. Fusing means 212, in general, comprises any means of applying electrical power to first electrode 201 and second electrode 206 to create an electrically conductive path between the two electrodes.

As recited in co-pending U.S. patent application Ser. No. 08/249,524, application of AC and DC electric fields across first electrode 201 and second electrode 206 of antifuse element 200 of FIG. 2 causes the breakdown of antifuse dielectric layer 205 to form a conductive filament completing the circuit between previously unconnected first electrode 201 and second electrode 206.

Figure 3:
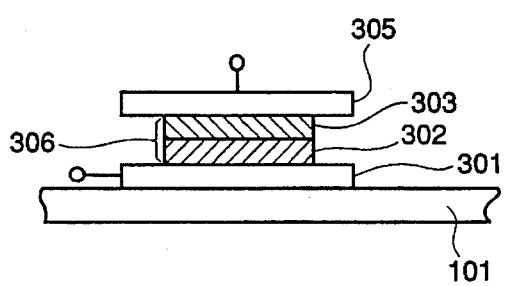
FIG. 3 shows another alternative exemplary embodiment of the present invention in which multiple layers of differing insulating material are combined to provide the dielectric layer of the antifuse element.

FIG. 3 shows a side cross-sectional view of another possible exemplary preferred embodiment of an antifuse element 300 of the present invention. First electrode 301 is deposited or otherwise formed on substrate 101 similar to electrodes described above. Antifuse layers 306 are next deposited or otherwise formed atop first electrode 301. In this embodiment, antifuse layers 306 is comprised of a plurality of chemically distinct individual layers of dielectric materials. A first dielectric layer 302 is deposited or otherwise formed atop first electrode 301. A second dielectric layer 303 is formed atop first dielectric layer 302. Dielectric layer 303 is a chemically distinct material from dielectric layer 302; here chemically distinct means that one material 303 has a different chemical formula than the other material 302. Second electrode 305 is finally deposited or otherwise formed atop second dielectric layer 303. As recited in co-pending U.S. patent application Ser. No. 08/249,524, the AC electric field applied across first electrode 301 and second electrode 305 during the programming of antifuse element 300 generates significant heat in antifuse layers 306. This heating of the antifuse layers 306 caused by the application of an AC electric field causes an annealing process to blend the elements of antifuse layers 306. Precise selection of the multiple layers of antifuse layers 306 permits a particular desired material possessing specific chemical and electrical properties to be constructed in the annealing process which forms the conductive filament. This control of the stoichiometry in fabrication of antifuse element 300 of the present invention enables the resultant conductive filament to be optimized for conductivity. Improved conductivity of the conductive filament permits reduction in the size of the cross-sectional area of the conductive filament which in turn permits increased density of programmable antifuse elements in an integrated circuit design.

Specifically by way of example, first dielectric layer may comprise strontium bismuth tantalate ($SrBi_2Ta_2O_9$) and second dielectric layer may comprise zinc oxide (ZnO). When heat is generated within the two layers by combined application of the AC and DC electric fields, the materials fuse to form a composite material, namely strontium bismuth tantalate with conductive filaments of zinc oxide penetrating it, which composite material provides excellent conductivity and adhesion to first and second electrodes 301 and 305. In some cases, believed to be connected with more complete melting of the materials in the fusing process, the resultant material is a single material, namely zinc-oxide-doped strontium bismuth tantalate. Alternatively, second dielectric layer may be another conductive metal oxide, such as ruthenium or iridium oxide, or another ferroelectric material such as barium bismuth titanate ($Ba_xBi_yTiO_3$). Another combination that is effective is ($Ba_xBi_yTiO_3$) layered with a mixture of zinc an niobium, i.e. Zn*Nb. Preferably, $0.05< <1$, $0.05<y<1.0$, and the amount of zinc is 0.1 to 3 times the amount of niobium. In the latter case, the conductive material resulting after the fusing process is believed to be a more complex material that may fill or partially fill the space between the electrodes, rather than just filaments of the material or a doped material. That is, the materials are believed to combine, at least partially, to produce a single chemical compound.

It is evident that antifuse layer 306 can comprise more than two layers. Three or more materials may also be deposited, which layers may all fuse together to form a single fused material, or, depending on the electrical properties of the materials, only some of them may fuse leaving a layered structure in which at least one layer performs the connecting function and other layers may form adhesion, barrier, or other functions. For example, the $(Ba_xBi_yTiO_3)$/Zn*Nb combination may be layered on strontium bismuth tantalate. The ability to use multiple layers considerably enhances the possibility for forming combinations which provide the excellent insulative properties desirable in the unfused state and the excellent conducting properties desirable in the fused state.

Figure 4:
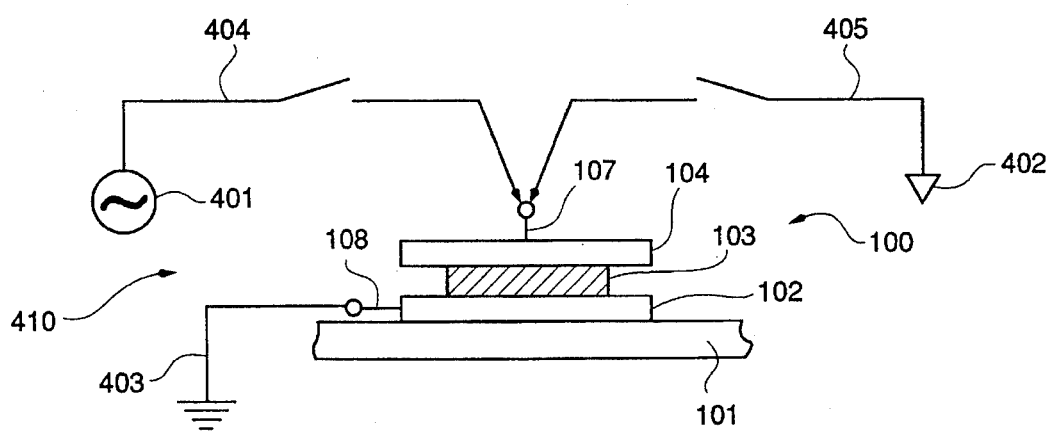
FIG. 4 shows an exemplary circuit used to program an antifuse element designed in accord with the methods of the present invention.

FIG. 4 depicts an exemplary circuit 410 for programming a single antifuse element 100 of the present invention. First electrode 102 of antifuse element 100 is connected to ground 403 via wiring layer 108. AC source 401 is connected via wire 404 and wiring layer 107 to second electrode 104 to provide an AC electric field across first electrode 102 and second electrode 104. DC source 402 is connected via wire 405 and wiring layer 107 to second electrode 104 to provide a DC electric field across first electrode 102 and second electrode 104. The frequency and amplitude of the applied AC electric field is dependent on the material selected for antifuse dielectric layer 103 of FIG. 4. Typical frequency values may range from 10 Khz through 10 Mhz. A frequency is selected for the particular dielectric layer so as to reduce the amplitude of the applied DC electric field required to breakdown antifuse dielectric layer 103. The DC electric field is applied in pulses while the AC electric field is being continuously applied to the dielectric layer 103.

The efficacy of combining AC and DC electric fields to breakdown the dielectric layer 103 may be understood by the following. In a ferroelectric material, there is a spontaneous electric dipole moment. The applied AC electric field causes this dipole to oscillate, which produces heat, analogous to the way continuously bending a wire produces heat. When a DC electric field is placed on the ferroelectric, it causes the dipole moment to increase, which causes the heating effect to increase significantly. This can also be expressed in terms of the dielectric constant of a material, which is typically expressed as the complex number:

$$\epsilon = \epsilon_1 - i\epsilon_2, \quad (1)$$

where $\epsilon_1$ is the real part of the dielectric constant, i is the square root of a negative 1, and $\epsilon_2$ is the imaginary part of the dielectric constant. The electric current J is given by:

$$J = dD/dt = d(\epsilon E)/dt = d(\epsilon E_0 e^{i\omega t})/dt = [(i\epsilon_1\omega) + (\epsilon_2\omega)]E, \quad (2)$$

where D is the displacement vector and E is the electric field. As is known in the art, the imaginary part of J corresponds to the heating of the material with dielectric constant $\epsilon$, while the real part of J corresponds to the ordinary electrical current. Thus equation (2) indicates that the heating of the dielectric is proportional to $\epsilon_1\omega$. In a ferroelectric, $\epsilon_1$ increases dramatically with a small DC electric field. Thus the dielectric heating due to the AC electric field increases dramatically with a small applied DC electric field. Thus when a small DC electric field is pulsed across ferroelectric layer 103 while an AC electric field is being applied, the heating suddenly increases and the material fuses. Thus the combination of AC and DC electric fields permits the insulating layer to be broken down with a smaller field amplitudes than would be required using either DC or AC electric fields alone. Obviously, this effect will occur with any material in which the dielectric constant increases with DC electric field, not just ferroelectric materials. However, since ferroelectric materials generally have dielectric constants that increase significantly with the application of DC electric fields, these materials can be expected to work particularly well with the combination AC and DC electric fields.

Antifuse elements made in accordance with the teachings of the present invention require a smaller DC electric field than prior antifuse designs to cause the breakdown of the insulating material to form a conductive filament between the previously unconnected points. It takes energy to create the AC electric field, and one can consider this energy to be stored in the oscillations temporarily. Then when the DC electric field is applied, the energy in the oscillations suddenly is converted into heat energy which fuses the material. Thus, the amplitude of the applied DC electric field is greatly reduced over that which would be required to breakdown the dielectric material in the absence of an AC electric field. The precise amplitude of the applied DC electric field, the number of pulses, and the duration of the pulses required to breakdown the dielectric layer will vary depending on the material selected for the dielectric layer. For ferroelectric materials such as discussed above, the AC electric field oscillates between +5 volts and −5 volts and the DC electric field is typically below 2 volts.

Figure 5:
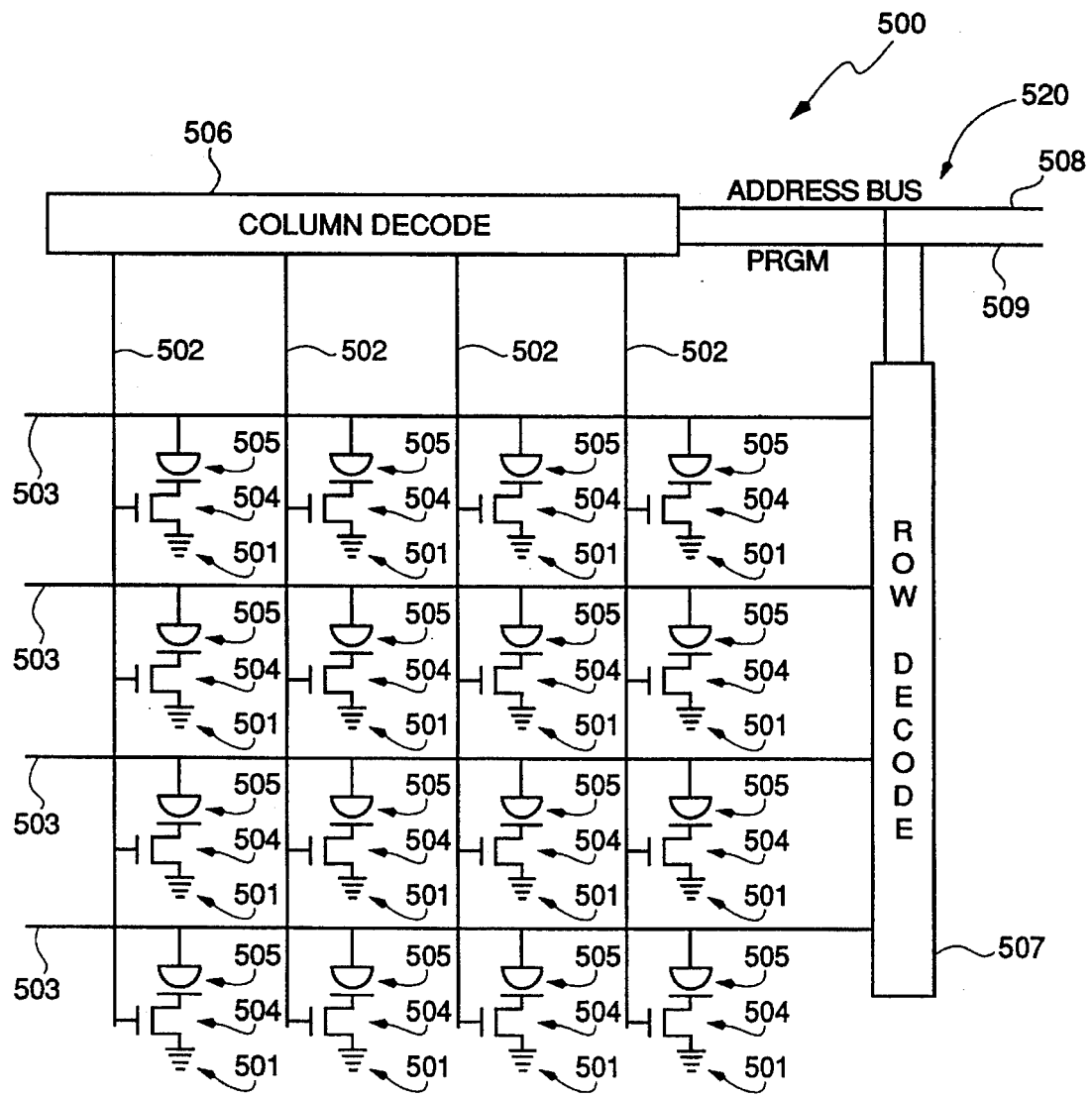
FIG. 5 shows an exemplary application of a matrix of antifuse elements arranged with associated address decoding circuits to form a PROM.

FIG. 5 shows a typical application of a two-dimensional matrix of antifuse elements in association with other components to implement a programmable read-only memory 500 (PROM). PROM 500 is an OTP device comprising a 4×4 array of memory cells which may be programmed once to record a binary digit at each memory cell 501 and later may be accessed to read the recorded binary digit. A memory cell 501 is formed at each intersection of one word line 502 and one bit line 503. Each memory cell 501 comprises an N-channel transistor 504 and a ferroelectric antifuse element 505 as discussed above. FIG. 5 shows one end of each antifuse element 505 attached to a corresponding bit line 503. The other end of each antifuse element 505 is attached to the drain of N-channel transistor 504. The drain of each N-channel transistor 504 is manufactured to be initially disconnected from the corresponding bit line 503. By programming the corresponding antifuse element 505 (as discussed below) the drain of an N-channel transistor 504 is connected to the corresponding bit line 503. The gate of each N-channel transistor 504 is attached to a corresponding word line 502 and the source of each N-channel transistor 504 is attached to ground. To sense the stored binary digit from a memory cell 501, a voltage sufficient to turn on the desired transistor is applied to the gate of the N-channel transistor 504 over word line 502. Simultaneously, a voltage is applied to the bit line 503 attached to the antifuse element 505 associated with the desired transistor. If the associated antifuse element 505 has been programmed to connect the selected bit line 503 to the drain of the N-channel transistor, then bit line 503 will be pulled to ground indicating a logic 0 value is stored in the memory cell 501. If the associated antifuse element 505 has not been programmed, bit line 503 will remain at the applied voltage indicating a logic 1 value is stored in the memory cell 501.

In the unprogrammed state, each memory call 501 contains a logic "1" bit. To program a memory cell 501 to contain a logic "0" bit, a voltage sufficient to turn on the desired transistor is applied to the gate of the N-channel transistor 504 over word line 502. This connects one end of the unprogrammed associated antifuse element 505 to ground through the transistor. Simultaneously, AC and DC electric fields are applied to the bit line 503 attached to the opposite end of the unprogrammed antifuse element 505 associated with the desired transistor. As described above, the combination of AC and DC electric fields across the electrodes of antifuse element 505 will cause the ferroelectric insulative layer within antifuse element 505 to fuse and thus "program" the element to a logic "0".

Column decode logic 506 selects a desired word line 502 and applies the required voltage to sense or program a selected memory cell based on the linear address supplied on address bus 508. Row decode logic 507 selects a desired bit line 503 and applies the required electric fields to sense or program a selected memory cell based on the linear address supplied on address bus 508. Row decode logic 507 applies the required programming electric fields when the PRGM pin 509 is sensed active.

Those skilled in the art will recognize that by simple modifications to the elements comprising PROM 500 of FIG. 5, a programmable logic device (PLD) could be fabricated using the antifuse elements 505 of the present invention. By removing transistor 504 from each cell 501, antifuse elements 505 then serve to directly connect a word line 502 to an intersecting bit line 503. Input and output electrodes for logic gates can be connected to word lines 502 and bit lines 503 to permit complex logic functions to be "programmed" into the programmable matrix device.

There has been described novel structures and processes for fabricating programmable antifuse elements using ferroelectric materials in the dielectric layer. There has also been described an integrated circuit applying a matrix of such ferroelectric antifuse devices to create a programmable read-only memory. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, the structures and processes may be combined with a wide variety of other structures and processes. Equivalent materials, different material thicknesses, and other methods of depositing the substrate and electrode layers may be used. It is also evident that the process steps recited may in some instances be performed in a different order. Or equivalent structures and processes may be substituted for the various structures and processes described.

We claim:

1. An electrically programmable antifuse device comprising:

first and second electrodes;

a dielectric layer electrically insulating said first electrode from said second electrode, said dielectric layer comprising a layered superlattice material; and fusing means for controllably altering said dielectric layer to form an electrical conductor connecting said first and second electrodes.

2. The programmable antifuse device of claim 1 wherein said dielectric layer comprises strontium bismuth titanate ($SrBi_2Ta_2O_9$).

3. The programmable antifuse device of claim 1 wherein said dielectric layer comprises a plurality of layers of physically distinct materials.

4. The programmable antifuse device of claim 3 wherein said plurality of layers of physically distinct materials comprises a first layer of strontium bismuth titanate ($SrBi_2Ta_2O_9$) and a second layer of zinc oxide (ZnO).

5. The programmable antifuse device of claim 3 wherein said plurality of layers of physically distinct materials comprises a first layer of strontium bismuth titanate ($SrBi_2Ta_2O_9$) and a second layer of barium bismuth titanate ($Ba_xBi_yTiO_3$).

6. The programmable antifuse device of claim 1 wherein said first electrode includes a barrier layer.

7. The programmable antifuse device of claim 1 wherein said second electrode includes a barrier layer.

8. The programmable antifuse device of claim 1 wherein said fusing means comprises: means for controllably applying an AC electric field of predetermined AC amplitude across said first and second electrodes; and means for controllably applying a DC electric field of predetermined DC amplitude across said first and second electrodes.

9. An electrically programmable antifuse device comprising:

first and second electrodes;

a dielectric layer electrically insulating said first and second electrodes, said dielectric layer comprising a plurality of physically distinct materials selected to form a conductive material when fused, wherein at least one of said plurality of physically distinct materials is a layered superlattice material; and fusing means for controllably altering said dielectric layer to form an electrical conductor connecting said first and second electrodes.

10. The programmable antifuse device of claim 9 wherein said plurality of physically distinct materials comprises a first layer of strontium bismuth titanate ($SrBi_2Ta_2O_9$) and a second layer of zinc oxide (ZnO).

11. The programmable antifuse device of claim 9 wherein said plurality of physically distinct materials comprises a first layer of strontium bismuth titanate ($SrBi_2Ta_2O_9$) and a second layer of barium bismuth titanate ($Ba_xBi_yTiO_3$).

12. The programmable antifuse device of claim 9 wherein said first electrode includes a barrier layer.

13. The programmable antifuse device of claim 9 wherein said second electrode includes a barrier layer.

14. The programmable antifuse device of claim 9 wherein said fusing means further comprises: means for controllably applying an AC electric field of predetermined AC amplitude across said first and second electrodes; and means for controllably applying a DC electric field of predetermined DC amplitude across said first and second electrodes.

15. A programmable array integrated circuit comprising:

a substrate material;

a plurality of row electrode means formed in substantially parallel rows on said substrate material;

a plurality of column electrode means formed in substantially parallel columns substantially perpendicular to said plurality of row electrode means, each of said plurality of column electrodes intersecting the plane of each of said plurality of row electrodes;

dielectric means for electrically insulating each of said intersecting row and column electrode means, said dielectric means comprising a layered superlattice material; and fusing means for controllably altering said dielectric means at any one of said intersections of said row and column electrode means to form an electrical conductor connecting said one of said intersecting row and column electrode means.

16. The programmable array integrated circuit of claim 15 wherein said dielectric means comprises strontium bismuth titanate ($SrBi_2Ta_2O_9$).

17. The programmable array integrated circuit of claim 15 wherein said dielectric means comprises a plurality of layers of physically distinct materials, and wherein a low impedance electrically conductive material is formed to electrically connect said intersecting row and column electrode means by operation of said fusing means on said plurality of materials.

18. The programmable array integrated circuit of claim 17 wherein said plurality of layers of physically distinct materials comprises a first layer of strontium bismuth titanate ($SrBi_2Ta_2O_9$) and a second layer of zinc oxide (ZnO).

19. The programmable array integrated circuit of claim 17 wherein said plurality of layers of physically distinct materials comprises a first layer of strontium bismuth titanate ($SrBi_2Ta_2O_9$) and a second layer of barium bismuth titanate ($Ba_xBi_yTiO_3$).

20. The programmable array integrated circuit of claim 15 wherein said row electrode means includes a barrier layer.

21. The programmable array integrated circuit of claim 15 wherein said column electrode means includes a barrier layer.

22. The programmable array integrated circuit of claim 15 wherein said fusing means further comprises: means for controllably applying an AC electric field of predetermined AC amplitude across said one of said intersecting row and column electrode means; and means for controllably applying a DC electric field of predetermined DC amplitude across said one of said intersecting row and column electrode means.

* * * * *

UNITED STATES PATENT AND TRADEMARK OFFICE
CERTIFICATE OF CORRECTION

PATENT NO. : 5,463,244

DATED : October 31, 1995

INVENTOR(S) : Paz de Araujo, et al.

It is certified that error appears in the above-indentified patent and that said Letters Patent is hereby corrected as shown below:

On the title page item [75], change "Carlos A. P. De Araujo" to --Carlos A. Paz de Araujo--

| | | |
|---|---|---|
| Column 9 | line 60 | change "titanate" to read --tantalate-- |
| | line 67 | change "titanate" to read --tantalate-- |
| Column 10 | line 4 | change "titanate" to read --tantalate-- |
| | line 31 | change "titanate" to read --tantalate-- |
| | line 35 | change "titanate" to read --tantalate-- |
| Column 11 | line 1 | change "titanate" to read --tantalate-- |
| | line 11 | change "titanate" to read --tantalate-- |
| | line 15 | change "titanate" to read --tantalate-- |

Signed and Sealed this

Thirtieth Day of April, 1996

Attest:

BRUCE LEHMAN

Attesting Officer      Commissioner of Patents and Trademarks